（12） United States Patent
Liu et al.

(10) Patent No.: US 6,413,863 B1
(45) Date of Patent: Jul. 2, 2002

(54) METHOD TO RESOLVE THE PASSIVATION SURFACE ROUGHNESS DURING FORMATION OF THE ALCU PAD FOR THE COPPER PROCESS

(75) Inventors: Chung-Shi Liu; Shau-Lin Shue; Chen-Hua Yu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/489,971

(22) Filed: Jan. 24, 2000

(51) Int. Cl.[7] .............................................. H01L 21/44
(52) U.S. Cl. ...................... 438/687; 438/597; 438/676; 438/688; 438/926
(58) Field of Search ................................ 438/597, 598, 438/612, 618, 625, 629, 676, 687, 688, 937, 926

(56) References Cited

U.S. PATENT DOCUMENTS 4,902,646 A * 2/1990 Nakano ....................... 438/577
5,071,714 A * 12/1991 Rodbell et al. ............. 428/620

(List continued on next page.)

OTHER PUBLICATIONS

Chapman, "Glow Discharge Processes", 1980, Wiley & Sons, Inc.*
Wolf et al. "Silicon Processing for the VLSI ERA vol. 1: Process Technology", 1986, Lattice press.*
Lin et al., "Effects of Ti–Containing Underlayers on Planarization and Microstructure of Magnetron Sputtered Al–Cu Thin Films", 1988, Fifth International IEEE VLSI Multilevel Interconnection Conference, pp. 76–84.*

Puttlitz et al., "Semiconductor Interlevel Shorts Caused be Hillock Formation in Al–Cu Metallization", 1989, IEEE Trans. on Components, Hybrids, and Manufacturing Tech., pp. 619–626.*

Primary Examiner—Matthew Smith
Assistant Examiner—Lex H. Malsawma
(74) Attorney, Agent, or Firm—George O. Saile; Stephen B. Ackerman

(57) ABSTRACT

In accordance with the objectives of the invention a new method is provided to create aluminum pads that overlay an electrical contact point. A layer of passivation is deposited over the surface that contains one or more electrical contact points, the layer of passivation is patterned thereby creating openings in the layer of passivation that overlay and align with one or more of the contact points. Under the first embodiment of the invention, a layer of AlCu is deposited over the patterned layer of passivation thereby including the openings that have been created in the layer of passivation. The deposited layer of AlCu is patterned and etched thereby creating the required AlCu bond pad. In addition to creating the required AlCu bond pad, the etch of the layer of AlCu also creates a pattern of dummy AlCu pads that are not in contact with any underlying points of electrical contact but that are located on the surface of the layer of passivation. The dummy AlCu pads counteract the above indicated effect of theta phase propagation that occurs during the AlCu etching resulting in a passivation layer that has a smooth surface and that therefore provides a good underlying layer for the created AlCu pads. Under the second embodiment of the invention, a layer of pure aluminum is sputter deposited over the passivation layer including the openings that has been created in the passivation layer. The deposited layer of aluminum is patterned and etched thereby creating the required aluminum pad.

9 Claims, 5 Drawing Sheets

U.S. PATENT DOCUMENTS

| | | | | |
|---|---|---|---|---|
| 5,104,826 | A | * 4/1992 | Fujita et al. | 437/190 |
| 5,148,259 | A | * 9/1992 | Kato et al. | 357/67 |
| 5,182,235 | A | * 1/1993 | Eguchi | 438/618 |
| 5,278,105 | A | * 1/1994 | Eden et al. | 438/129 |
| 5,300,307 | A | * 4/1994 | Frear et al. | 427/96 |
| 5,430,325 | A | 7/1995 | Sawada et al. | 257/618 |
| 5,441,915 | A | * 8/1995 | Lee | 438/631 |
| 5,476,817 | A | * 12/1995 | Numata | 438/619 |
| 5,494,853 | A | * 2/1996 | Lur | 438/631 |
| 5,582,679 | A | 12/1996 | Lianjuu et al. | 156/651.1 |
| 5,618,757 | A | * 4/1997 | Bothra et al. | 438/699 |
| 5,639,697 | A | * 6/1997 | Weling et al. | 438/633 |
| 5,789,313 | A | * 8/1998 | Lee | 438/599 |
| 5,798,298 | A | * 8/1998 | Yang et al. | 438/622 |
| 5,811,352 | A | * 9/1998 | Numata et al. | 438/622 |
| 5,817,577 | A | 10/1998 | Ko | 438/694 |
| 5,843,842 | A | 12/1998 | Lee et al. | 438/688 |
| 5,854,125 | A | * 12/1998 | Harvey | 438/626 |
| 5,861,342 | A | * 1/1999 | Gabriel et al. | 438/631 |
| 5,866,482 | A | * 2/1999 | Lee | 438/720 |
| 5,888,889 | A | 3/1999 | Frisina et al. | 438/545 |
| 5,899,706 | A | * 5/1999 | Kluwe et al. | 438/129 |
| 5,915,201 | A | * 6/1999 | Chang et al. | 438/666 |
| 5,924,006 | A | * 7/1999 | Lur et al. | 438/626 |
| 5,946,589 | A | * 8/1999 | Ng et al. | 438/586 |
| 5,956,612 | A | 9/1999 | Elliott et al. | 438/637 |
| 5,981,384 | A | * 11/1999 | Juengling | 438/666 |
| 6,030,895 | A | * 2/2000 | Joshi et al. | 438/679 |
| 6,080,652 | A | * 6/2000 | Yamaha et al. | 438/622 |
| 6,080,657 | A | * 6/2000 | Liu et al. | 438/627 |
| 6,093,631 | A | * 7/2000 | Jaso et al. | 438/618 |
| 6,110,819 | A | * 8/2000 | Colgan et al. | 438/625 |
| 6,121,136 | A | * 9/2000 | Sung | 438/672 |
| 6,140,236 | A | * 10/2000 | Restaino et al. | 438/687 |
| 6,157,082 | A | * 12/2000 | Merchant et al. | 257/758 |
| 6,284,647 | B1 | * 9/2001 | Chien et al. | 438/633 |
| 6,303,484 | B1 | * 10/2001 | Chen | 438/595 |
| 6,309,956 | B1 | * 10/2001 | Chiang et al. | 438/622 |
| 6,319,818 | B1 | * 11/2001 | Stamper | 438/631 |
| 6,344,281 | B1 | * 2/2002 | Smith et al. | 428/651 |

* cited by examiner

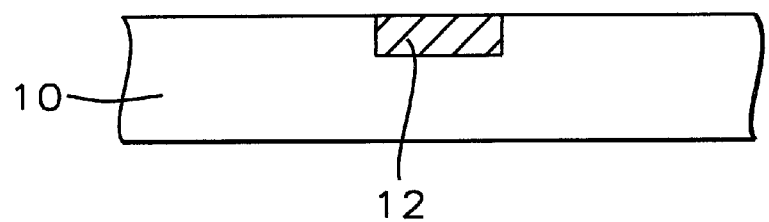
FIG. 1a - Prior Art
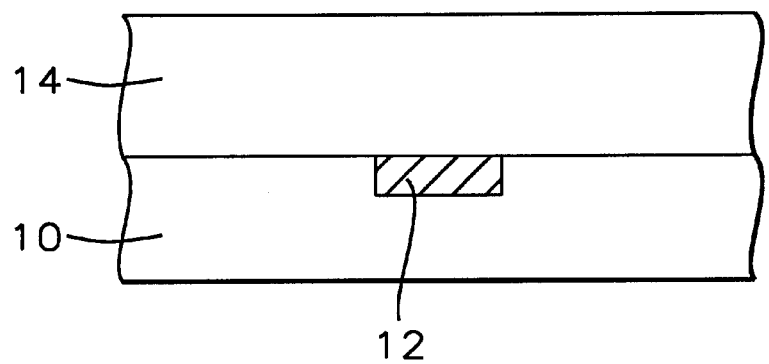
FIG. 1b - Prior Art
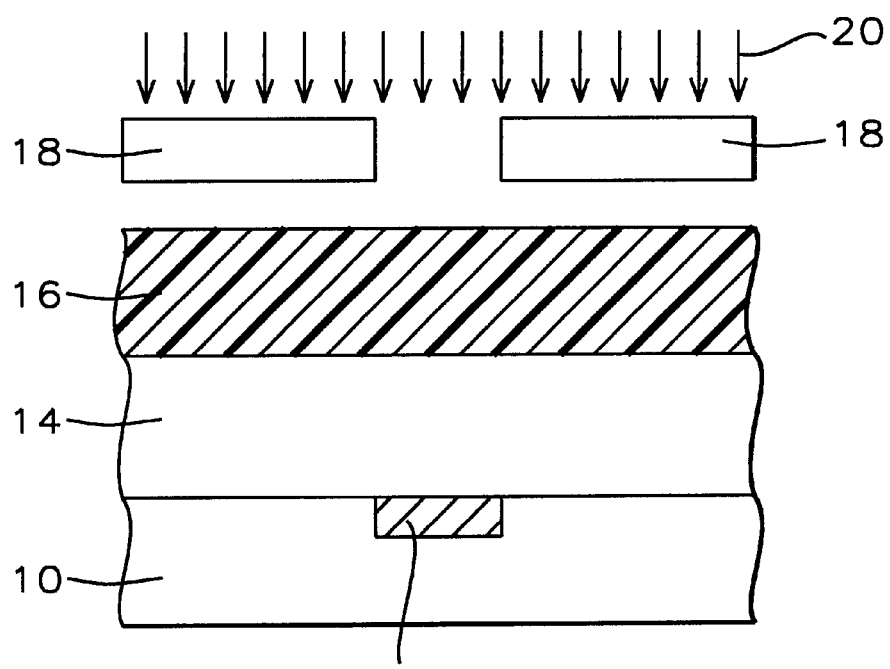
FIG. 1c - Prior Art

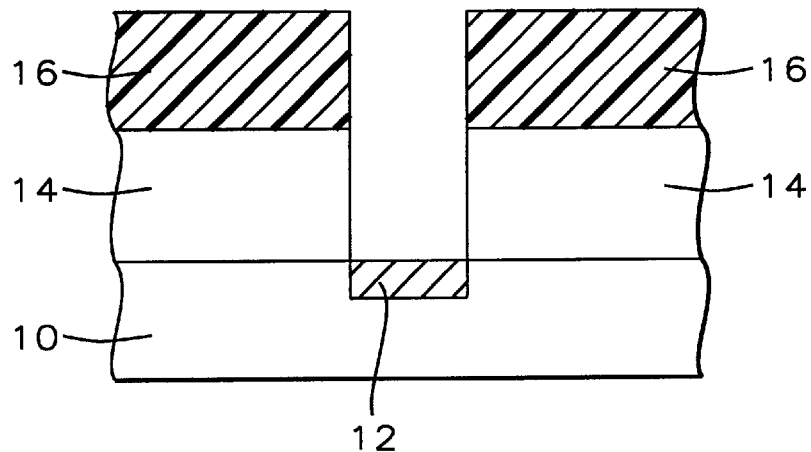
*FIG. 1d - Prior Art*
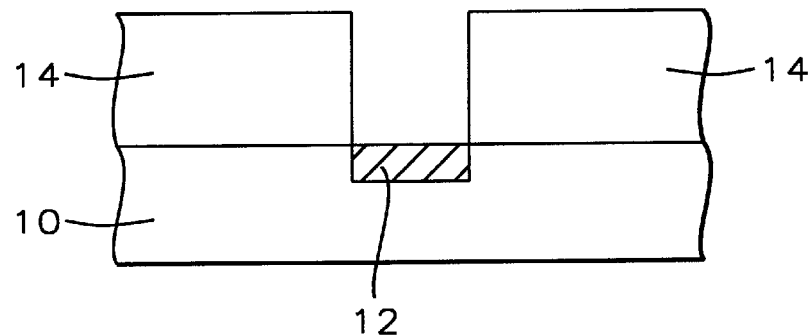
*FIG. 1e - Prior Art*
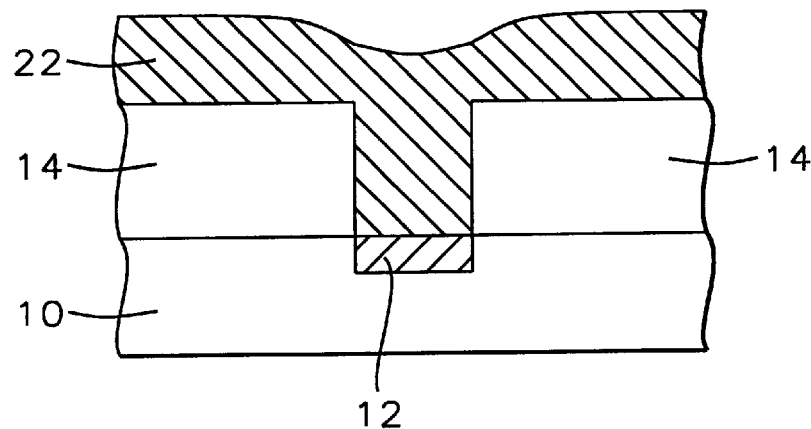
*FIG. 1f - Prior Art*

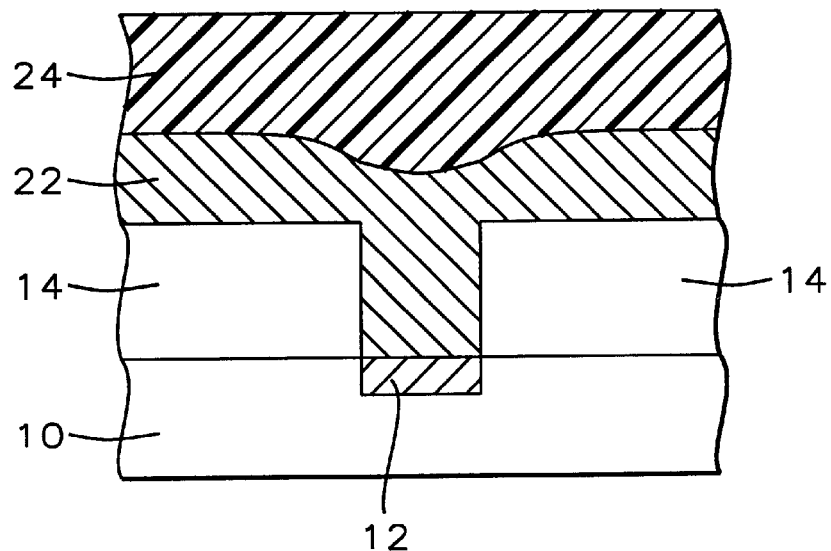
FIG. 1g – Prior Art
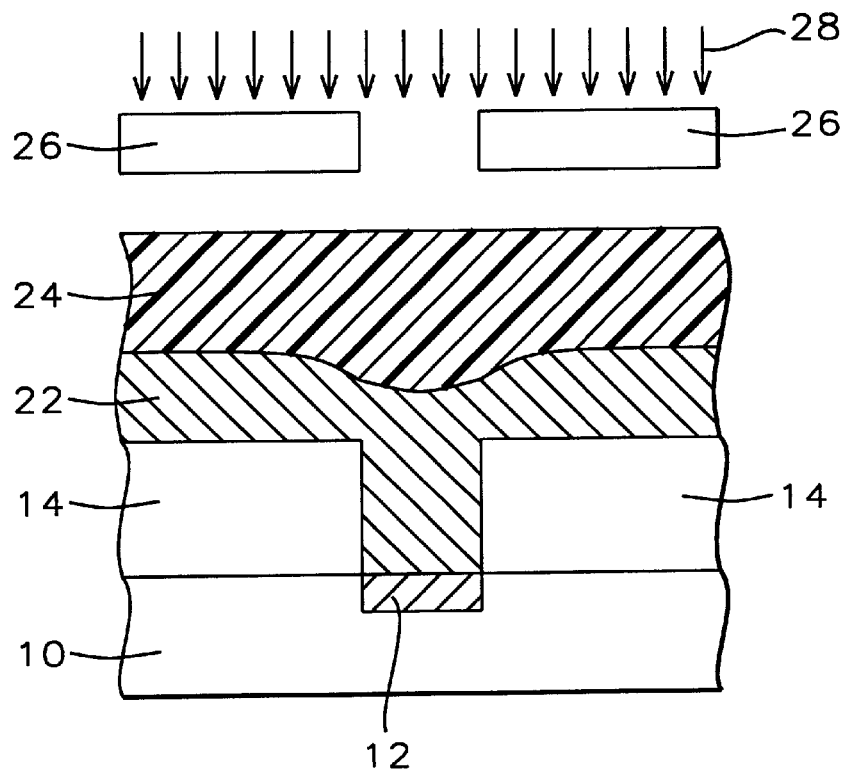
FIG. 1h – Prior Art

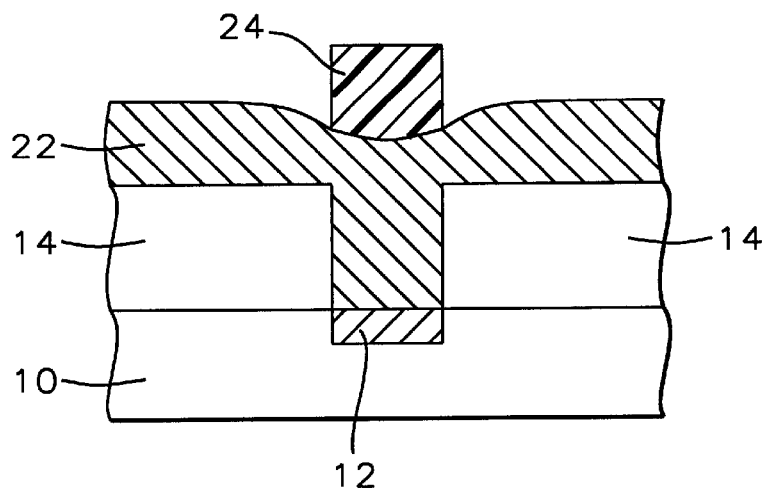
*FIG. 1i - Prior Art*
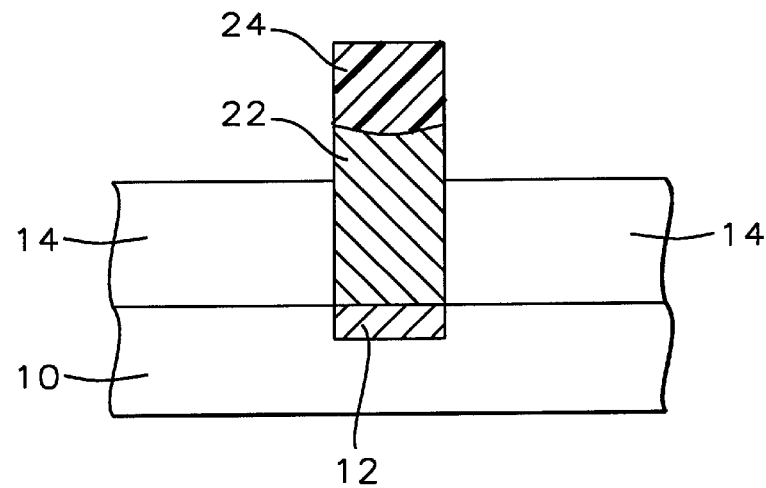
*FIG. 1j - Prior Art*
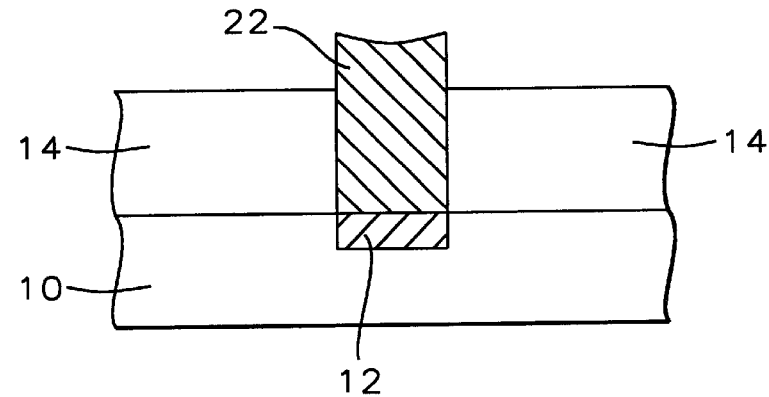
*FIG. 1k - Prior Art*

METHOD TO RESOLVE THE PASSIVATION SURFACE ROUGHNESS DURING FORMATION OF THE ALCU PAD FOR THE COPPER PROCESS

BACKGROUND OF THE INVENTION (1) Field of the Invention

The invention relates to the fabrication of integrated circuit devices, and more particularly, to a method of providing a smooth pad surface for good surface adhesion during the formation of AlCu pads as part of a copper metallization process.

(2) Description of the Prior Art

This invention relates to the creation of pad structures that are used for integrated circuits. This invention more particularly relates to two methods of forming AlCu pads that are used as part of copper metallization whereby both methods are aimed at increasing the smoothness of the pad surface thereby increasing adhesion of metal interconnect lines that are connected to these pads.

In creating semiconductor devices, the technology of interconnecting devices and device features is of great importance. Bond pads are frequently used for this purpose, it is a requirement in creating semiconductor devices that bond pads can be produced that are simple, reliable and inexpensive. Bond pads reliability depends for a significant part on the adhesion that is provided between the pad surface and the wires that are connected to the bond pad. Better adhesion results in increased pad reliability, pad adhesion is improved by making the surface of the bond pad to which the wires are connected smooth thereby creating increased surface interaction resulting in better adhesion. A rough bond pad surface can be caused by an underlying layer of passivation that has a relatively rough surface. By reducing the impact that the rough, underlying passivation has on the smoothness of the AlCu pad, the reliability of the bond pad is improved.

Bond pads are generally used to wire device elements and to provide exposed contact regions of the die, these contact regions are suitable for wiring the die to components that are external to the die. An example is where a bond wire is attached to the bond pad of a semiconductor die at one end and to a portion of a Printed Circuit Board at the other end of the wire. The art is constantly striving to achieve improvements to the creation of bond pads that simplify the manufacturing process while enhancing bond pad reliability.

A frequently used bond pad consists of an exposed aluminum pad. A gold bond wire can be bonded to this aluminum pad. This type of connection however is highly temperature dependent. At ambient temperatures below about 150 degrees C., the gold of the bond wire will not chemically interact with the aluminum of the pad making the physical attachment and the electrical connection between the gold wire and the aluminum pad sufficiently reliable. At higher temperatures however, above about 150 degrees C., gold starts to interact with the aluminum as a consequence of which the bond rapidly deteriorates. As a result, porosity, delamination and voiding occur within the bond. These effects become more pronounced with the aging of the bond and will eventually result in bond failure. Potential reliability problems therefore prevent using the aluminum bond pad under conditions where the ambient temperature is known to be in excess of 150 degrees C. Furthermore, even when the ambient temperature is less than approximately 150 degrees C., the aluminum bond pad is susceptible to corrosion simply because it is exposed.

Aluminum grows a passivating oxide layer in air and is as a consequence protected against corrosion. Aluminum wiring used in semiconductors, however, contains copper, which does not have a passivating oxide, and the Al—Cu alloy used is more vulnerable to corrosion. The corrosion of aluminum wires is caused by several sources such as chlorine transported through the plastic packaging and the passivation materials, chlorine from the etching compounds and as etching by-products, phosphorous acid formed from excess phosphorous in the phosphosilicate glass, etc. Only a small amount of chlorine is required to cause severe local corrosion of the aluminum lines. Aluminum corrosion can, in addition, occur very quickly after metal etching.

To avoid etching introduced corrosion, chlorine compounds and elemental chlorine must be removed from the metal surface immediately after plasma etching. A water rinse or a water vapor treatment usually accomplishes this.

Modern metal structures use multi-levels of dissimilar materials such as Ti/TiN/Al—Cu/TiN or Ti/Al—Cu/TiN, which increases the possibility of electromechanical corrosion.

Copper is electro-positive with respect to hydrogen and is not vulnerable to corrosion. However, in air copper oxide grows linearly with time, indicating the lack of a protective oxide. This lack of a passivating oxide makes copper more vulnerable to chemical corrosion. To avoid or minimize this corrosion, most applications of copper metalization involve some protective layer deposited on top of the copper.

Materials that are used for bond pads include metallic materials such as tungsten and aluminum while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach of doping avoids inter-diffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads.

Methods have been proposed for creating bond caps that require capping of the layer of metal. A barrier layer is thereby deposited over the layer of metal, the barrier layer is patterned after which the barrier layer and the layer of metal are etched. The metal layer is thereby selectively exposed, the bond pad is formed over the barrier layer typically using electrolysis technology.

The conventional processing sequence that is used to create an aluminum pad has been detailed in FIG. 1. No processing conditions or materials that are used for the following sequence will be highlighted since these processing conditions and materials all fall within the scope of the present art.

The process starts with a semiconductor surface 10, FIG. 1a, typically the surface of a silicon single crystalline substrate, in which a copper electrical contact point 12 has been provided. This contact point can be a point of interconnect with a network of metal lines or it can be a contact point or a point to which a via needs to be established. Point 12 can also be an alignment mark that is typically used to position wafers inside semiconductor processing tools. A passivation layer 14 is deposited over the surface 10, FIG. 1b, an opening overlying the contact point 12 is first created in the passivation layer. For this purpose, a first layer 16 of photoresist, FIG. 1c, is deposited over the passivation layer 14 and exposed using mask 18. The exposure to the light source 20 makes the photoresist soluble in the area where the light impacts the photoresist, the photoresist can therefore readily be removed over the area of light impact. FIG. 1d shows a cross section after the exposed first photoresist has been removed and the exposed underlying layer 14 of passivation has been etched in accordance with the opening that has been created in the first layer 16 of photoresist. The patterned first layer 16 of photoresist can now be removed resulting in the cross section that is shown in FIG. 1e. The aluminum from which the aluminum pad will be created is next deposited, layer 22, FIG. 1f. The aluminum layer needs to be patterned, a second layer 24 of photoresist is therefore deposited over the layer 22 of aluminum, FIG. 1g. This second layer 24 of photoresist is exposed by light source 28 via mask 26, FIG. 1h. The non-exposed second photoresist is removed leaving a layer 24, FIG. 1i, of second photoresist in place above the layer of aluminum whereby this second photoresist is aligned with the contact point 12. The layer 22 can now be etched, FIG. 1j, leaving the aluminum layer 22 in place above the contact point 12. Remains the removal of the patterned second layer of photoresist, FIG. 1k, which completes the creation of the aluminum pad 22 overlying the contact point 12.

The above process of creating bond pads has assumed that the bond pad is formed using aluminum as a pad material. The process of the invention addresses the application where AlCu is used for the plug material. This addition of small quantities of copper to the aluminum has been found to improve the electromigration resistance while this addition further reduces the occurrence of hillocks, that is small protrusions of aluminum on the surface of the thin film layer of aluminum.

The process of creating AlCu bond pad as indicated above has the disadvantage that roughness in the layer of passivation that underlies the created Al bond pads creates roughness in the surface of the created bond pads. This passivation layer surface roughness is due to the theta phase propagation that occurs during the AlCu etching, an effect that is even more pronounced where a blanket deposition of a layer of AlCu is performed over a large surface area. The invention addresses this aspect of the formation of AlCu bond pads and provides a method whereby roughness of the underlying passivation layer does not affect the quality of the created bond pad. The theta phase propagation effect provides a measure of passivation surface roughness, such as tetrahedral type that is present at the surface of a passivation layer.

U.S. Pat. No. 5,888,889(Frisina et al.) teaches a method to form dummy cells having a top metal layer.

U.S. Pat. No. 5,817,577(Ko) teaches a method for forming dummy metal lines.

U.S. Pat. No. 5,430,325(Sawada et al.) shows a dummy pattern for a chip.

U.S. Pat. No. 5,582,679(Lianjun et al.) teaches an Al layer (e.g., BP) etch process.

U.S. Pat. No. 5,956,612(Elloitt et al.) teaches a pure Al metal for a contact, see col. 4.

U.S. Pat. No. 5,843,842(Lee et al.) teaches a pure Al metal for a wiring layer, see col. 7, line 5.

SUMMARY OF THE INVENTION

A principle objective of the invention is to provide a method of creating aluminum pads whereby the pad surface is free of imperfections.

In accordance with the objectives of the invention a new method is provided to create aluminum pads that overlay an electrical contact point. A layer of passivation is deposited over the surface that contains one or more electrical contact points, the layer of passivation is patterned thereby creating openings in the layer of passivation that overlay and align with one or more of the contact points. Under the first embodiment of the invention, a layer of AlCu is deposited over the patterned layer of passivation thereby including the openings that have been created in the layer of passivation. The deposited layer of AlCu is patterned and etched thereby creating the required AlCu bond pad. In addition to creating the required AlCu bond pad, the etch of the layer of AlCu also creates a pattern of dummy AlCu pads that are not in contact with any underlying points of electrical contact but that are located on the surface of the layer of passivation. The dummy AlCu pads counteract the above indicated effect of theta phase propagation that occurs during the AlCu etching resulting in a passivation layer that has a smooth surface and that therefore provides a good underlying layer for the created AlCu pads. Under the second embodiment of the invention, a layer of pure aluminum is sputter deposited over the passivation layer including the openings that has been created in the passivation layer. The deposited layer of aluminum is patterned and etched thereby creating the required aluminum pad.

BRIEF DESCRIPTION OF THE DRAWINGS

FIG. 1 shows a sequence of Prior Art processing steps that are followed in creating an aluminum pad following conventional processing, as follows:

FIG. 1a shows a cross section of a semiconductor surface that contains a point of electrical contact FIG. 1b shows a cross section after a layer of passivation has been deposited FIG. 1c shows a cross section after a first layer of photoresist has been deposited, the layer of photoresist is being exposed by a light source FIG. 1d shows a cross section after the exposed photoresist has been removed and the layer of passivation has been etched in accordance with the pattern that has been created in the layer of photoresist FIG. 1e shows a cross section after the first layer of patterned photoresist has been removed FIG. 1f shows a cross section after a layer of aluminum has been sputtered over the surface of the passivation layer including the opening that has been created in the passivation layer FIG. 1g shows a cross section after a second layer of photoresist has been deposited over the surface of the layer of aluminum FIG. 1h shows a cross section while the second layer of photoresist is being exposed by a light source FIG. 1i shows a cross section after the non-exposed second photoresist has been removed FIG. 1j shows a cross section after the layer of aluminum has been etched FIG. 1k shows a cross section after the patterned second layer of photoresist has been removed.

FIG. 2a shows a cross section after the layer of passivation has been deposited and patterned thereby forming an opening above and aligned with the electrical contact point FIG. 2b shows a cross section after a layer of AlCu has been deposited over the surface of the layer of passivation thereby including the opening that has been created in the layer of passivation FIG. 2c shows a cross section after the layer of AlCu has been patterned and etched thereby creating the required AlCu bond pad and a pattern of dummy pads.

FIG. 2d shows a cross section after a layer of pure aluminum has been deposited, patterned and etched thereby creating a bond pad of pure aluminum.

DESCRIPTION OF THE PREFERRED EMBODIMENTS

Figure 2A:
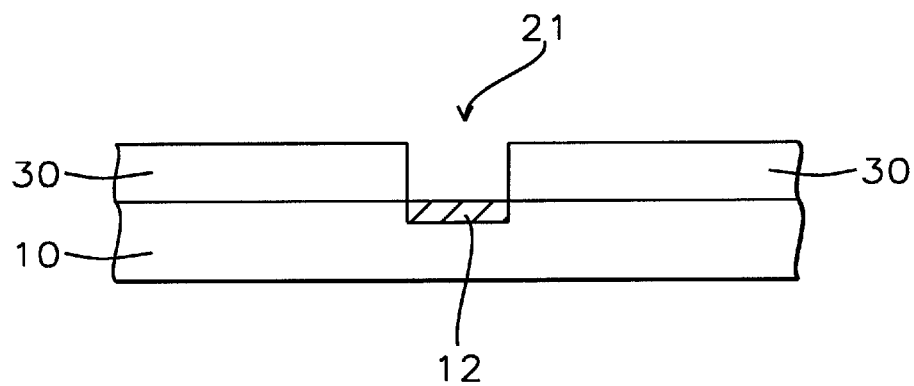
FIGS. 2a through 2d shows the processing flow of the invention to form an aluminum pad, as follows. It is thereby assumed that the sequence of cross sections that have been shown under FIG. 1a through and including FIG. 1e are part of the processing flow of the process of the invention.

Referring now specifically to FIG. 2a, there is shown a cross section of a surface 10 over which a layer 30 of passivation has been deposited. The passivation layer 30 has been patterned and etched creating an opening 21 in the layer of passivation that overlays and aligns with the contact point 12.

Various materials have found application in the creation of passivation layers. Passivation layer can contain silicon oxide/silicon nitride ($SiO_2/Si_3N_4$) deposited by CVD, passivation layer can be a photosensitive polyimide or can comprise titanium nitride. Another material often used for passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure such as the ability to fill openings of high aspect ratio, a relatively low dielectric constant (about 3.2), a simple process required for the depositing of a layer of polyimide, the reduction of sharp features or steps in the underlying layer, high temperature tolerance of cured polyimide. Photosensitive polyimides have these same characteristics but can, in addition, be patterned like a photoresist mask and can, after patterning and etching, remain on the surface on which they have been deposited to serve as a passivation layer.

A passivation layers can be deposited using PECVD technology at a temperature between about 350 and 450 degrees C. with a pressure of between about 2.0 and 2.8 Torr for the duration between about 8 and 12 seconds.

Typical passivation etching uses $Ar/CF_4$ as an etchant at a temperature of between about 120 and 160 degrees C. and a pressure of between about 0.30 and 0.40 Torr for a time of between about 33 and 39 seconds using a dry etch process.

Other passivation etching uses $He/NF_3$ as an etchant at a temperature of between about 80 and 100 degrees C. and a pressure of between about 1.20 and 1.30 Torr for a time of between about 20 and 30 seconds using a dry etch process.

The passivation layer 30 of the invention is deposited using PECVD technology at a temperature between about 350 and 450 degrees C. with a pressure of between about 2.0 and 2.8 Torr for the duration between about 8 and 12 seconds deposited to a thickness that is between about 2000 and 6000 Angstrom thicker than the height of the to be created aluminum pad.

Figure 2B:
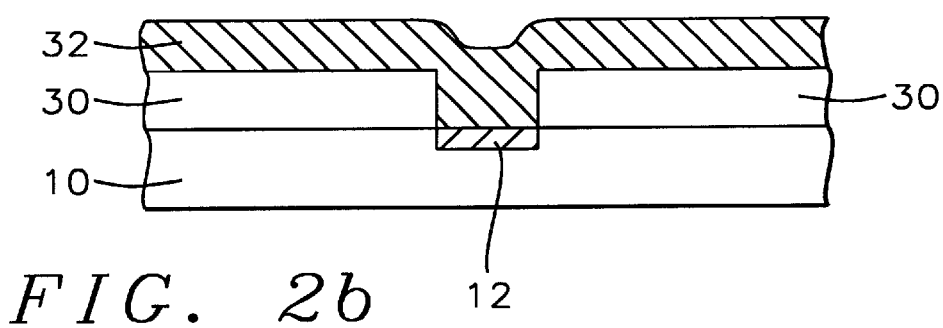

FIG. 2b shows a cross section after a layer 32 of aluminum has been sputter deposited over the surface of the layer 30 of passivation thereby including the opening that has been created in this layer 30 of passivation.

The process of the invention deposits the layer 32 using conventional methods of metal rf sputtering at a temperature between about 100 and 400 degrees C. and a pressure between about 1 and 100 mTorr using as source aluminum-copper material, layer 32 is deposited to a thickness between about 4,000 and 11,000 Angstrom.

Different methods of depositing a layer of low resistivity metal such as aluminum and its alloys have been widely explored for the creation of fine line interconnects in semiconductor manufacturing. Such metal as $Al_xCu_y$ is an example of fine line interconnect metals. Due to the continued scaling down of line width dimensions in very large scale integrated (VLSI) circuitry manufacturing, problems of reliability have occurred including problems of inadequate isolation, electromigration, and planarization. A key problem is filling high aspect ratio vias and lines without voids or seams and creating homogeneous structures. Furthermore, high temperature bias sputtering (i.e. above 450 degrees C.) technique has been attempted but this technique has limitations below 1 um geometries. Conventional techniques such as chemical vapor deposition (CVD) or plating appear promising but as yet have not been applied to the fabrication of such structures. Currently, there is no method which allows the use of Physical Vapor deposition (PVD) techniques or which improves the quality of CVD or plating films if required for filling high aspect ratio vias and lines.

Figure 2C:
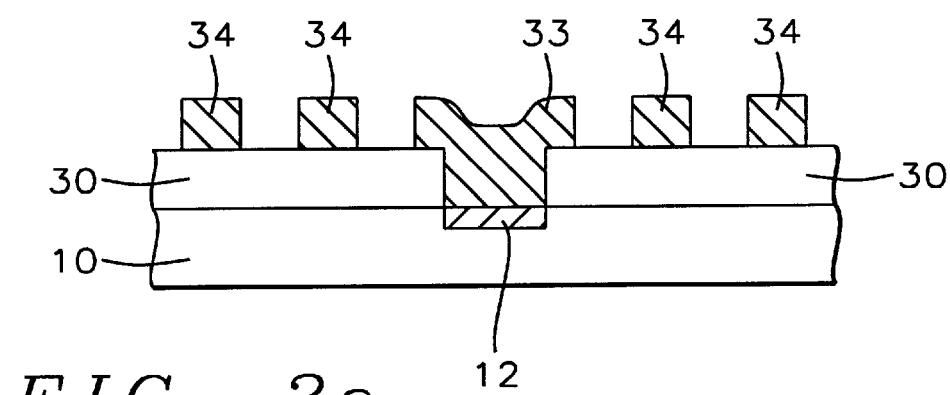

FIG. 2c shows a cross section after the deposited layer 32 of AlCu has been patterned and etched thereby creating the desired AlCu pad 33 in addition to the pattern 34 of dummy AlCu pads that reside on the surface of the passivation layer 30. It is clear that the dummy pads 34 are not electrically connected to any other elements of the structure that is shown in cross section in FIG. 2c. The dummy AlCu pads 34 counteract, as already indicated, the effect of theta phase propagation that occurs during the AlCu etching resulting in a passivation layer that has a smooth surface and that therefore provides a good underlying layer for the created AlCu pads.

The etching conditions for the etching of the layer of AlCu are as follows: etchant used: $Cl_2/Ar$, temperature between 50 and 200 degrees C., etchant flow: 20 sccm for the $Cl_2$ and 1000 sccm for the Ar, pressure between about 50 mTorr and 10 Torr, time of the etch between 30 and 200 seconds.

Figure 2D:
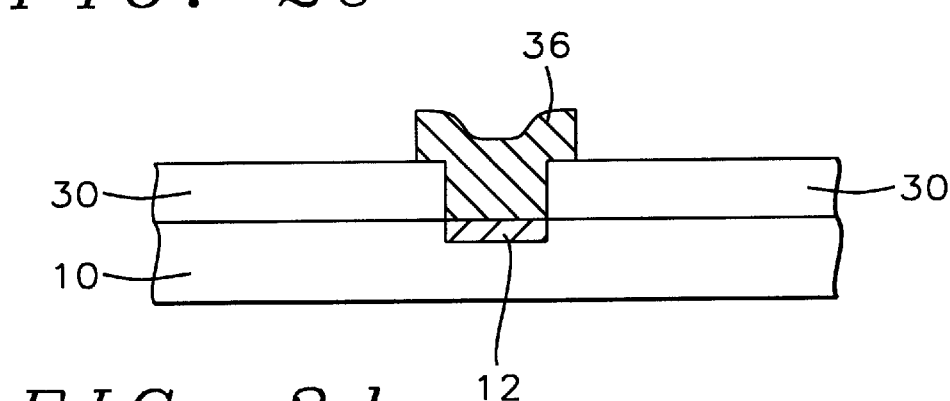

FIG. 2d addresses the second embodiment of the invention that essentially starts with a cross section as shown in FIG. 2a. The layer 30 of passivation has been deposited and etched creating opening 21 of FIG. 2a in this layer 30. A layer 36 of pure aluminum is deposited over the layer 30 of passivation resulting in a cross section that is essentially identical to the cross section that is shown in FIG. 2b where however, under the second embodiment of the invention, the layer 36 that is deposited is a layer of pure aluminum. This layer of pure aluminum is next patterned and etched to create the bond pad 36 of pure aluminum that is shown in FIG. 2d.

The etching conditions for the etching of the layer of pure aluminum are as follows: etchant used: $Cl_2/Ar$, temperature between about 50 and 200 degrees C., etchant flow rate: 20 sccm for the $Cl_2$ and 1000 sccm for the Ar, pressure between about 50 mTorr and 10 Torr, time of the etch between about 30 and 200 seconds.

The processes of the invention can be further extended by the application of barrier (of TiN or other) and or seed layers that are applied before the layer of AlCu or pure aluminum is deposited. It is also possible to further extend the processes of the invention with carefully controlled steps of reflow by applying a high-temperature anneal by either Rapid Thermal Processing (RTP) or laser exposure. These processes however must be carefully controlled in order to avoid damage to the barrier layer or to avoid the creation of highly reflective surfaces of the treated bond pad that can cause problems in further processing of the device.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming an AlCu pad for copper line interconnect, comprising the steps of:

providing a semiconductor substrate whereby said substrate has been provided with one or more electrical contact points and a surface passivation layer whereby furthermore openings have been created in said passivation layer that overlay and align with one or more of said electrical contact points;

rf sputter depositing a layer of AlCu over the surface of said layer of passivation thereby including said openings within said layer of passivation; and patterning and etching said layer of AlCu, said patterning and etching said layer of AlCu creating a pattern of AlCu bond pads that overlays said one or more of said electrical contact points in a surface of said substrate, further creating a pattern of dummy depositions of AlCu on a surface of said layer of passivation surrounding said pattern of AlCu bond pads whereby said dummy depositions of AlCu are not further interconnected to any surrounding device elements.

2. The method of claim 1 wherein said rf sputter depositing a layer of AlCu is rf sputtering at a temperature between-about 100 and 400 degrees C. and a pressure between about 1 and 100 mTorr using as source AlCu, deposited to a thickness between about 4000 and 11000 Angstrom.

3. The method of claim 1 wherein said passivation layer is deposited using PECVD technology at a temperature between about 350 and 450 degrees C. with a pressure of between about 2.0 and 2.8 Torr for the duration between about 8 and 12 seconds.

4. The method of claim 1 wherein said openings have been created in said passivation layer using $Ar/CF_4$ as an etchant at a temperature of between about 120 and 160 degrees C. and a pressure of between about 0.30 and 0.40 Torr for a time of between about 33 and 39 seconds using a dry etch process.

5. The method of claim 1 wherein said openings have been created in said passivation layer using $He/NF_3$ as an etchant at a temperature of between about 80 and 100 degrees C. and a pressure of between about 1.20 and 1.30 Torr for a time of between about 20 and 30 seconds using a dry etch process.

6. The method of claim 1 with the additional step of depositing a barrier layer over a surface of said passivation layer thereby including openings that have been created in said passivation layer, said step to be performed prior to said step of rf sputter depositing a layer of AlCu.

7. The method of claim 6 with the additional step of depositing seed layer over a surface of said barrier layer.

8. The method of claim 1 with the additional step of reflow of said formed AlCu pad by applying a high-temperature anneal, said additional step to be performed after said step of patterning and etching said layer of AlCu.

9. A method for forming an AlCu pad for copper line interconnect, comprising the steps of:

providing a semiconductor substrate whereby said substrate has been provided with a multiplicity of active devices whereby furthermore electrical points of contact have been provided in a surface of said substrate;

depositing a layer of passivation over a surface of said substrate;

patterning and etching said layer of passivation thereby creating openings in said layer of passivation that align with one or more of said points of electrical contact in a surface of said substrate;

rf sputter depositing a layer of AlCu over a surface of said layer of passivation thereby including said openings that have been etched in said layer of passivation; and patterning and etching said layer of AlCu thereby creating a pattern of AlCu bond pads that overlays said one or more of said electrical contact points in a surface of said substrate in addition to a pattern of dummy depositions of AlCu on a surface of said layer of passivation surrounding said pattern of AlCu bond pads whereby said dummy depositions of AlCu are not further interconnected to any surrounding device elements.

* * * * *